(12) United States Patent
Lu et al.

(10) Patent No.: US 8,119,310 B1
(45) Date of Patent: Feb. 21, 2012

(54) MASK-SHIFT-AWARE RC EXTRACTION FOR DOUBLE PATTERNING DESIGN

(75) Inventors: Lee-Chung Lu, Taipei (TW); Yi-Kan Cheng, Taipei (TW); Hsiao-Shu Chao, Boashan Township (TW); Ke-Ying Su, Hsin-Chu (TW); Cheng-Hung Yeh, Jhunan Township (TW); Dian-Hau Chen, Hsin-Chu (TW); Ru-Gun Liu, Hsin-Chu (TW); Wen-Chun Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 12/872,938

(22) Filed: Aug. 31, 2010

(51) Int. Cl.
*G03F 9/00* (2006.01)
*G06F 17/50* (2006.01)

(52) U.S. Cl. ............... 430/5; 430/22; 430/30; 382/144; 716/50; 716/136

(58) Field of Classification Search .............. 430/5, 22, 430/30; 382/144; 716/50, 53, 54, 136
See application file for complete search history.

(56) References Cited

U.S. PATENT DOCUMENTS 7,861,196 B2 * 12/2010 Huckabay et al. ............ 716/136
* cited by examiner

*Primary Examiner* — Christopher Young
(74) *Attorney, Agent, or Firm* — Slater & Matsil, L.L.P.

(57) ABSTRACT

A method includes providing a layout of an integrated circuit design, and generating a plurality of double patterning decompositions from the layout, with each of the plurality of double patterning decompositions including patterns separated to a first mask and a second mask of a double patterning mask set. A maximum shift between the first and the second masks is determined, wherein the maximum shift is a maximum expected mask shift in a manufacturing process for implementing the layout on a wafer. For each of the plurality of double patterning decompositions, a worst-case performance value is simulated using mask shifts within a range defined by the maximum shift.

20 Claims, 6 Drawing Sheets

| WIDTH/SPACING | S1 | S2 | S3 |
|---|---|---|---|
| W1 | C11 | C12 | C13 |
| W2 | C21 | C22 | C23 |

| WIDTH/SPACING | S1~S2 | S2~S3 |
|---|---|---|
| W1 | $\frac{(C12-C11)}{(S2-S1)}$ | $\frac{(C13-C12)}{(S3-S2)}$ |
| W2 | $\frac{(C22-C21)}{(S2-S1)}$ | $\frac{(C23-C22)}{(S3-S2)}$ |

```
*VARIATION_PARAMETERS

*(INDEX   NAME      MIN   MAX)
    1    M1_mask_x  -0.02  0.02
    2    M1_mask_y  -0.02  0.02
    3    M4_mask_x  -0.03  0.03
    4    M4_mask_y  -0.03  0.03

… # MASK-SHIFT-AWARE RC EXTRACTION FOR DOUBLE PATTERNING DESIGN

TECHNICAL FIELD

This disclosure relates generally to integrated circuit design, and more particularly to forming integrated circuits using double-patterning technology.

BACKGROUND

Double patterning is a technology developed for lithography to enhance the feature density. Typically, for forming features of integrated circuits on wafers, lithography technology is used, which involves applying a photo resist, and defining patterns on the photo resist. The patterns in the patterned photo resist are first defined in a lithography mask, and are implemented either by the transparent portions or by the opaque portions in the lithography mask. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to expose the same photo resist. In each of the masks, the distances between features are increased over the distances between features in the otherwise a single mask, and hence the optical proximity effect is reduced, or substantially eliminated.

Figure 1:
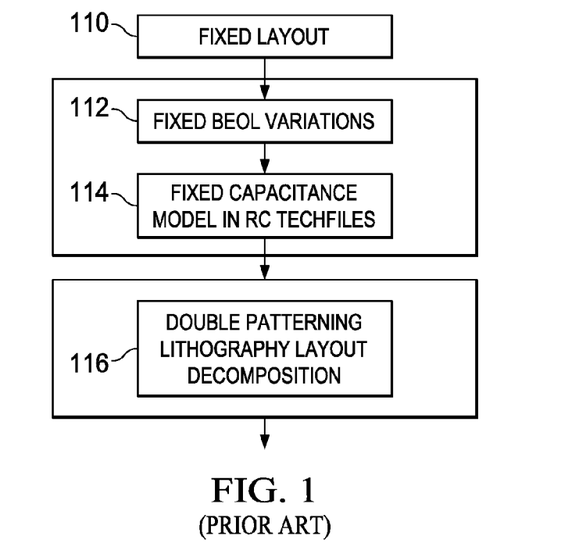
FIG. 1 illustrates a flow of a convention double patterning design.

FIG. 1 illustrates a flow of a convention double patterning design. Referring to step 110, a layout of an integrated circuit is determined, and a netlist for the layout is provided. The layout and the netlist are fixed since the sizes and the locations of all of the polygons involved in the layout have been determined. With the fixed layout, the possible back-end-of-line (BEOL) variation, which involves the variations of the metal lines in metal layers, can be estimated (step 112). However, the variations are estimated based on the fixed layout, and hence have fixed values. Next, in step 114, (parasitic) capacitance models are established to simulate the performance value of the integrated circuits, which involves calculating capacitances for metal lines by referring to techfiles. Techfiles may store the capacitances of metal lines as the function of the spacings between metal lines, and as a function of the widths of metal lines.

After the foundary receives the layout design, a layout decomposition is performed to separate the metal lines, for example, according to the double patterning design rules. Lithograph processes are performed to implement the layout on wafers. However, it was found that there was a mismatch between the simulated performance value (step 114) and the performance value measured from the actual wafers. One of the reasons is that when the lithography processes are performed, there may be a relative shift between the two lithography masks of a same double patterning mask. Such shift, however, was not reflected in the estimation of the performance values.

SUMMARY

In accordance with one aspect, a method includes providing a layout of an integrated circuit design, and generating a plurality of double patterning decompositions from the layout, with each of the plurality of double patterning decompositions including patterns separated to a first mask and a second mask of a double patterning mask set. A maximum shift between the first and the second masks is determined, wherein the maximum shift is a maximum expected mask shift in a manufacturing process for implementing the layout on a wafer. For each of the plurality of double patterning decompositions, a worst-case performance value is simulated using mask shifts within a range defined by the maximum shift.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 10 through 11B illustrate how nets in a layout are decomposed into different double patterning mask sets.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of finding optimum decomposition schemes and estimating the performance values of integrated circuits is provided. Throughout the various views and illustrative embodiments, like reference numbers are used to designate like elements.

Figure 2A:
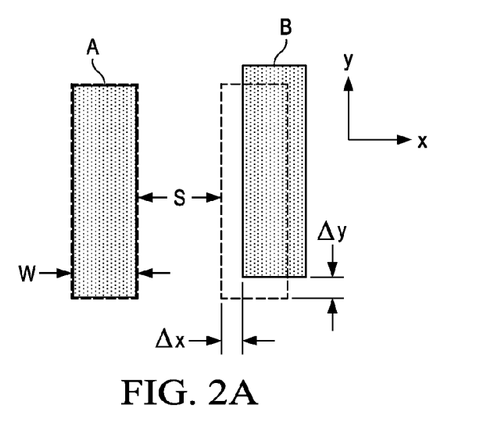
FIGS. 2A through 2C illustrate exemplary mask shifts.

FIG. 2A illustrates a transition shift that may occur during the exposure of two patterns. Patterns A and B may be patterns in a same layer, such as a metal layer or any other layer involved in the formation of integrated circuits, such as a polysilicon layer. Patterns A and B are double patterning patterns, with pattern A being in a first lithography mask of a double patterning mask set, and pattern B in a second lithography mask of the same double patterning mask set. Accordingly, patterns A and B are formed on a wafer at different time. Ideally, pattern B should be at the position shown using dotted lines, as designed. However, there may be process variations causing pattern B to shift from the intended position. The shift may be represented as Δx and Δy, with directions x and y being in the plane of the respective layer, which plane is also parallel to the major surfaces of the respective wafer. The shift causes the capacitance between patterns A and B to vary, and also causes the variation in performance values such as the timing and the noise, of the respective circuit.

Figure 2B:
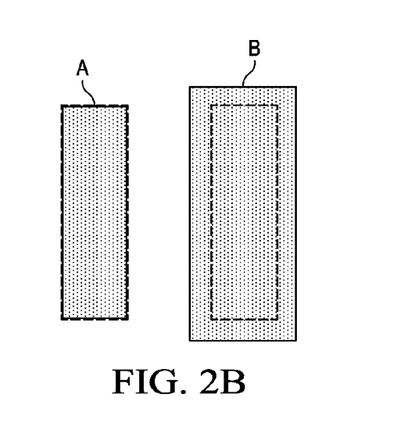
Figure 2C:
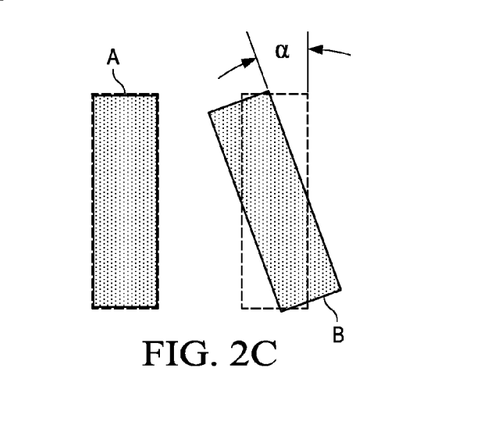

FIG. 2B illustrates a magnification shift (wherein the term "shift" may also be referred to as "variation"), wherein one of, or both, patterns A and B may have a variation from the designed sizes. FIG. 2C illustrates a rotation shift, wherein pattern B has a relative rotation with relative to pattern A. The magnification shift and the rotation shift also cause the variation in performance values. In the following embodiments, the transition shift as shown in FIG. 2A is used as an example to explain the concept of embodiments. However, the same concept may also be used in the magnification shift and rotation shift. For example, by replacing transition shift Δx with the magnification ratio (ratio of the actual size of pattern B to the designed size), the same concept may be used for the magnification shift. Further, by replacing transition shift Δx with the rotation angle α (the angle between direction of the actual pattern B and the designed direction of pattern B), the same concept may be used for the rotation shift.

Figure 3:
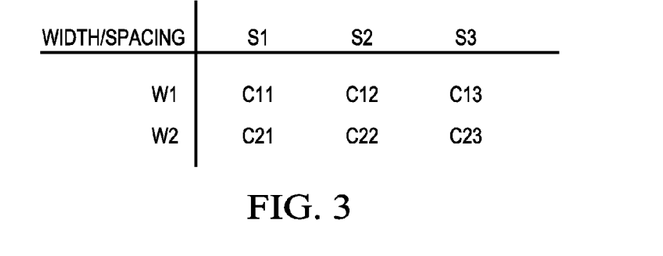
FIG. 3 illustrates a table listing capacitances of patterns in integrated circuits as a function of the spacings between the patterns, and as a function of the widths of the patterns.

Techfiles may be established to reflect the capacitance between patterns A and B as functions of spacing S and width W (shown in FIG. 2A) of patterns A or B. FIG. 3 illustrates a table indicating what may be stored in the techfiles. It is realized that the techfiles may use any format to store the information as shown in FIG. 3. In FIG. 3, it is observed that the change in widths W and/or spacing S results in the change in the capacitance between patterns A and B. For example, if width W is equal to W1, and spacing S is equal to S1, the respective capacitance is C11. If width W is equal to W1, and spacing S is equal to S2, the respective capacitance is C12. The contents in the techfiles may be retrieved in the subsequent simulation of the circuit performance value to speed up the simulation.

Figure 4:
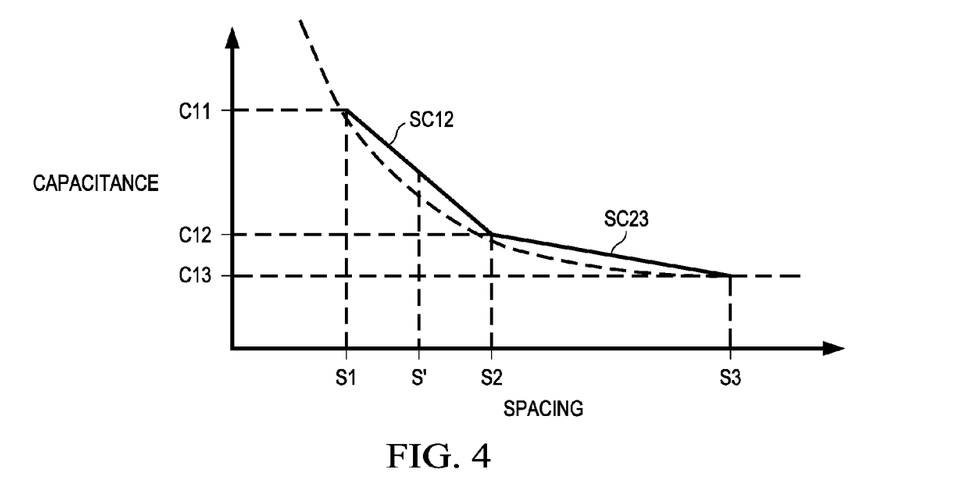
FIG. 4 illustrates a graph showing the capacitances of the patterns in integrated circuits as a function of the spacings between the patterns.

FIG. 4 illustrates the capacitance between patterns A and B as a function of spacing S. The dotted and curved line illustrates the actual capacitance. It is observed that only limited number of techfile items may be stored to reflect the relationship shown in FIG. 4, and there may be values not stored in the techfiles. For example, if spacing S' between two patterns is between spacings S1 and S2, then the capacitance corresponding to spacing S' cannot be retrieved from the techfiles directly. Accordingly, the sensitivity of capacitance to spacing S is established so that the capacitance corresponding to spacing S' may be calculated.

Figure 5:
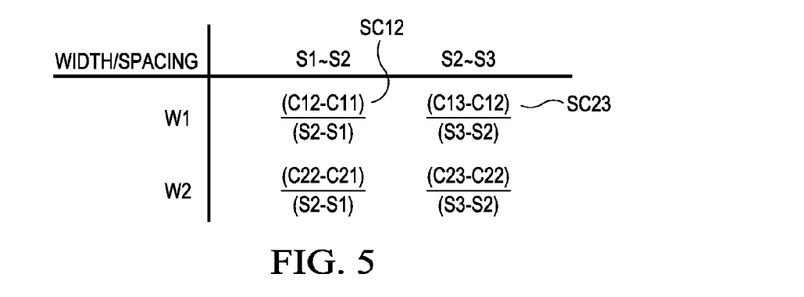
FIG. 5 illustrates a table listing capacitance sensitivities of the patterns in integrated circuits as a function of the spacings between the patterns, and as a function of the widths of the patterns.

FIG. 5 illustrates the sensitivity of capacitance to spacing S, wherein the sensitivity is related to the range spacing S' is in. Further, the sensitivity of capacitance is related to the respective line widths of patterns A and/or B. It is observed that sensitivity (C12−C1)/(S2−S1) is the slope SC12 (FIG. 4) of the solid line that is between spacings S1 and S2, and sensitivity (C13−C12)/(S3−S2) is the slope SC23 (FIG. 4) of the solid line that is between spacings S2 and S3. From FIG. 4, it is realized that if a spacing falls into any of the ranges between S1 and S2, or between S2 and S3, the respective capacitance may be calculated. The concept is further explained using FIGS. 6 through 8 and Equation 3.

Figure 6:
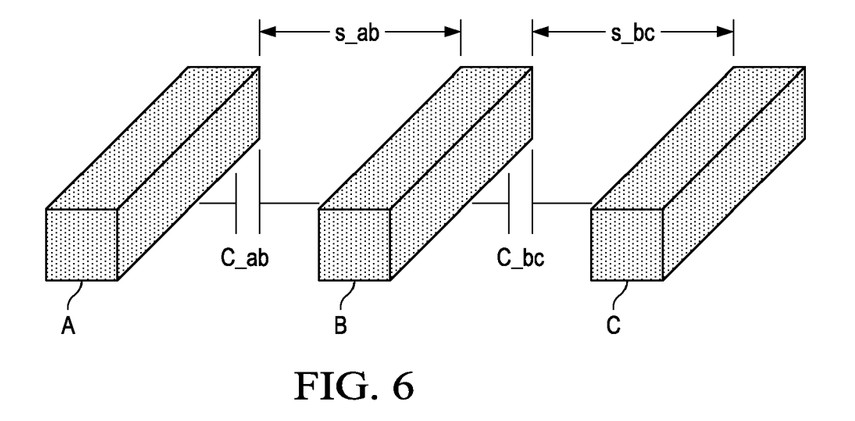
FIG. 6 illustrates the spacings between three patterns when no mask shift occurs.
Figure 7:
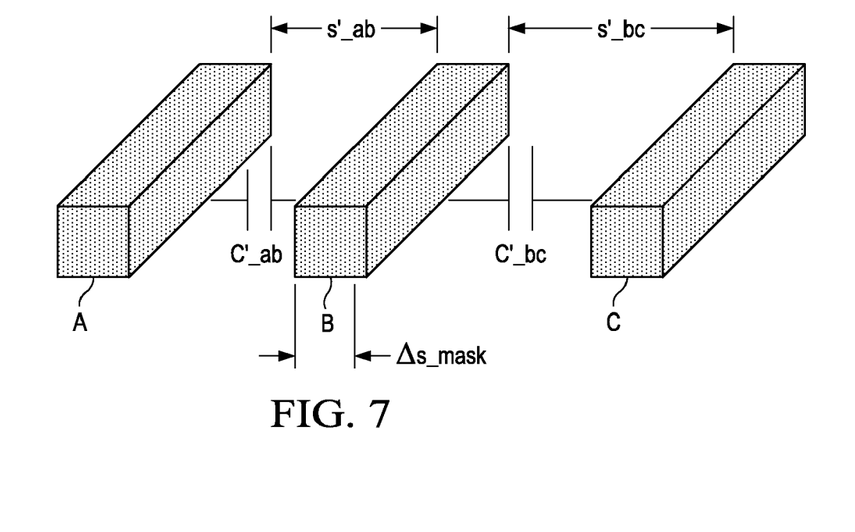
FIG. 7 illustrates the spacings between three patterns with a mask shift.

Referring to FIG. 6, patterns A, B, and C are double patterning patterns, with patterns A and C being in a first lithography mask of a double patterning mask set, and pattern B in a second lithography mask of the same double patterning mask set. FIG. 6 illustrates the as-designed spacings S_ab and S_bc, and the respective capacitances C_ab and C_bc.

Figure 8:
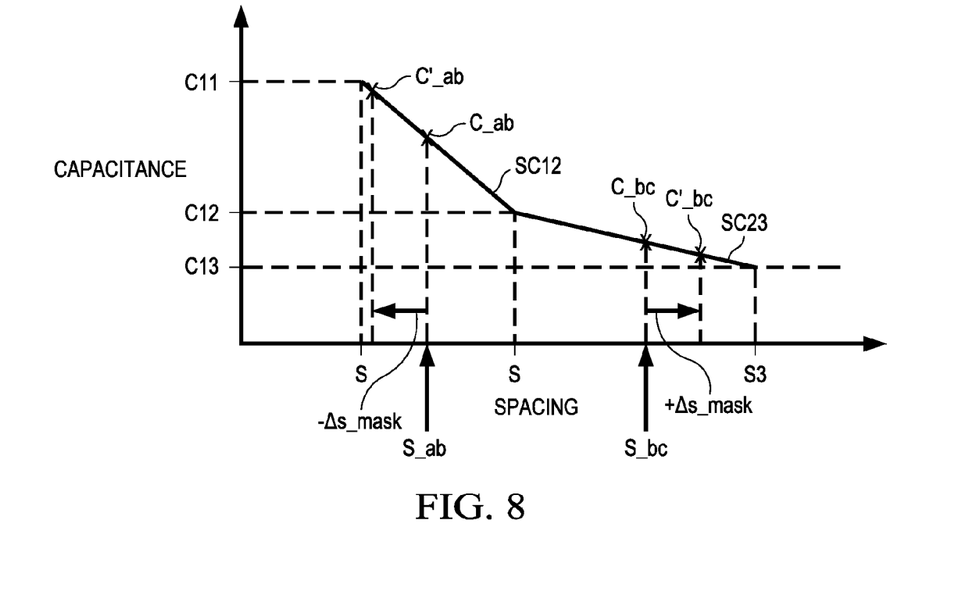
FIG. 8 illustrates the change in the capacitance between the patterns due to the mask shift.

If a transition shift occurs to cause mask shift Δs_mask (FIG. 7), then the capacitance between patterns A and B is changed to C'_ab, and the capacitance between patterns B and C is changed to C'_bc. The change in the capacitances may be generally expressed as the sensitivity of capacitance times mask shift Δs_mask. Accordingly, as illustrated in FIG. 8, the new capacitances C'_ab and C'_bc with mask shifts may be expressed as:

$$C'\_ab = C\_ab + SC12*(-\Delta s\_mask) \quad [\text{Eq. 1}]$$

$$C'\_bc = C\_bc + SC23*(+\Delta s\_mask) \quad [\text{Eq. 2}]$$

Wherein SC12 is the sensitivity (FIG. 4) corresponding to spacing range S1-S2, in which the new S'_ab falls into, and SC23 is the sensitivity corresponding to spacing range S2-S3, in which the new S'_bc falls into.

Since mask shift Δs_mask may include the mask shift Δx in the x direction and the mask shift Δy in the y direction, the new capacitance C (with the mask shift) between two patterns may be expressed as:

$$C = f(s + \Delta s\_mask) = \\ C_0 + \frac{\partial C}{\partial s} \Delta s\_mask = C_0 + \frac{\partial Cx}{\partial x}(\pm \Delta x) + \frac{\partial Cy}{\partial y}(\pm \Delta y) \quad [\text{Eq. 3}]$$

Wherein $$\frac{\partial Cx}{\partial x}$$

is the sensitivity of capacitance to the mask shift in x direction, and $$\frac{\partial Cy}{\partial y}$$

is the sensitivity of capacitance to the mask shift in y direction, and $C_0$ is the capacitance if no mask shift occurs. Equation 3 may further be modified to include the factors of magnification shift and the rotation shift.

Figure 9:
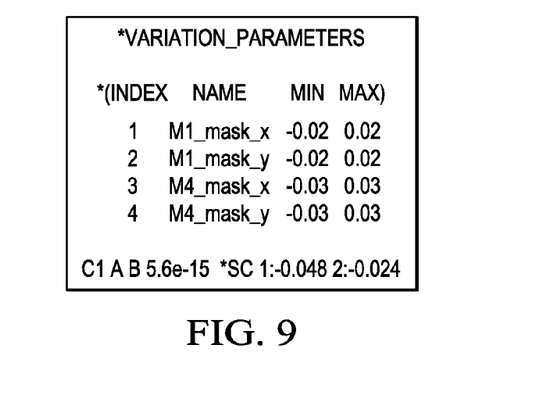
FIG. 9 illustrates a portion of a netlist including capacitances and sensitivities, wherein the netlist is extracted from a mask shift aware techfile.

In an embodiment, the capacitances between patterns (FIG. 3) and the capacitance sensitivities may be stored in the techfile(s) for the later retrieval. For example, FIG. 9 illustrates an exemplary format of a portion of a netlist including the capacitances and the capacitance sensitivities, wherein the portion of the netlist is extracted from a mask shift aware techfile. The line starting with index "1" indicates the maximum shift in metal layer 1 (M1), and the maximum mask shift in x direction is between −0.02 μm, which is in −x direction, and 0.02 μm in +x direction. It is noted that different netlist format may have different definitions, such as 1 sigma, 2 sigmas, 3 sigmas, and the like, wherein 3 sigma may have the exemplary value of 0.02 μm. Similarly, the lines starting with indices 2, 3, and 4 represent maximum shifts in layers M1 and M4, and in x and y directions. The maximum shifts are the possible (expected) maximum mask shifts that may occur, and it is expected that the respective mask shifts when the layout of the respective integrated circuit is implemented on an actual wafer will not possibly exceed these values. The maximum shifts are also used to calculate the maximum performance variation.

Further, the techfile item "C1 A B 5.6e-15*SC 1:−0.048 2:−0.024" represents that the capacitance C1 between nodes A and B is 5.6e-15 farads if no mask shift occurs, and the sensitivity of capacitance is −0.048 in layer M1 (for mask shifts in the x direction), and is −0.024 in layer M1 (for mask shifts in the y direction). Accordingly, with such a techfile, if a mask shift is known (or is assumed), the respective capacitance as a result of the mask shift may be calculated using the techfile and Equation 3.

Figure 10:
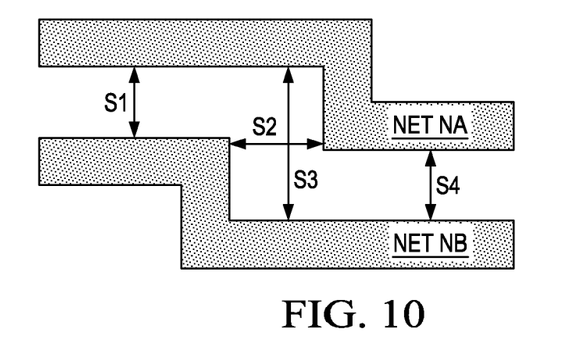
Figure 11A:
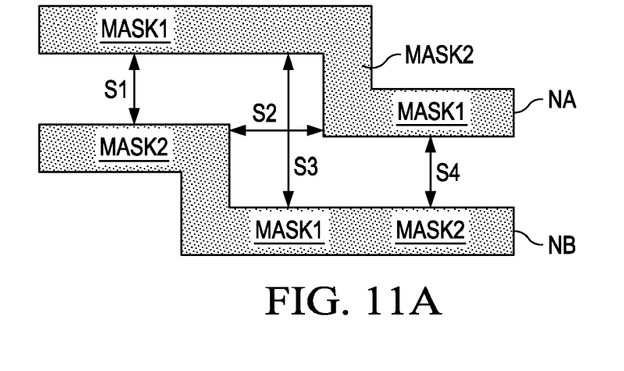
Figure 11B:
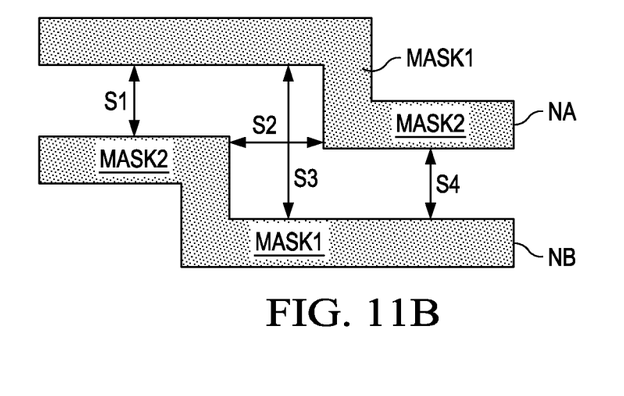

FIGS. 10 through 11B illustrate how layout decompositions are achieved for double patterning. Referring to FIG. 10, two nets (also referred to as patterns throughout the description) NA and NB are illustrated. Throughout the description, the term "net" refers to electrically connected metal lines and vias, wherein all metal lines (in the same and/or different metal layers) connected together, and hence have the same voltage potential, are referred to as being in a same net. The metal lines in the same net but are in different metal layers are interconnected through vias. Different portions of nets NA and NB have spacings S1, S2, S3, S4, and the like. According to the requirement of double patterning technology, if the spacing between any two patterns is less than a minimum spacing (known as G0) set by design rules, the two patterns should be decomposed into two masks of a double patterning mask set. Assuming spacings 51, S2, and S4 are smaller than G0, nets NA and NB need to be decomposed. There may be a plurality of schemes of performing the decomposition. For example, FIGS. 11A and 11B illustrate two schemes. It is realized since there are many nets in a circuit layout, there are many schemes of performing the decomposition. In FIGS. 11A and 11B, different sections of nets NA and NB are separated into lithography masks mask1 and mask2, which are in a same double patterning lithography mask set. Throughout the description, the decomposition schemes as shown in FIGS. 11A and 11B are referred to as decompositions 11A and 11B hereinafter.

As addressed in preceding paragraphs when the integrated circuit (layout) is manufactured on wafers, masks mask1 and mask2 may have a mask shift with relative to each other, which includes a transition shift, a magnification shift, and/or a rotation shift (FIGS. 2A through 2C). Accordingly, since the patterns of mask1 and mask2 in decompositions 11A and 11B are different, the performances of the resulting circuits formed using decompositions 11A and 11B are different from each other. At the time of design, it cannot be predicted what the actual mask shift will be when the integrated circuit is manufactured. However, the worst-case performance values resulted from the mask shift for decomposition 11A may be simulated, and the worst-case performance values resulted from the mask shift for decomposition 11B may also be simulated. Accordingly, by selecting the decomposition whose worst-case performance values are the best among the worst-case performance values of all available decompositions, it can be guaranteed that even if the worst-case scenario occurs, the minimum performance value requirement for the integrated circuit can still be satisfied, and the optimum performance value can be achieved.

Figure 12:
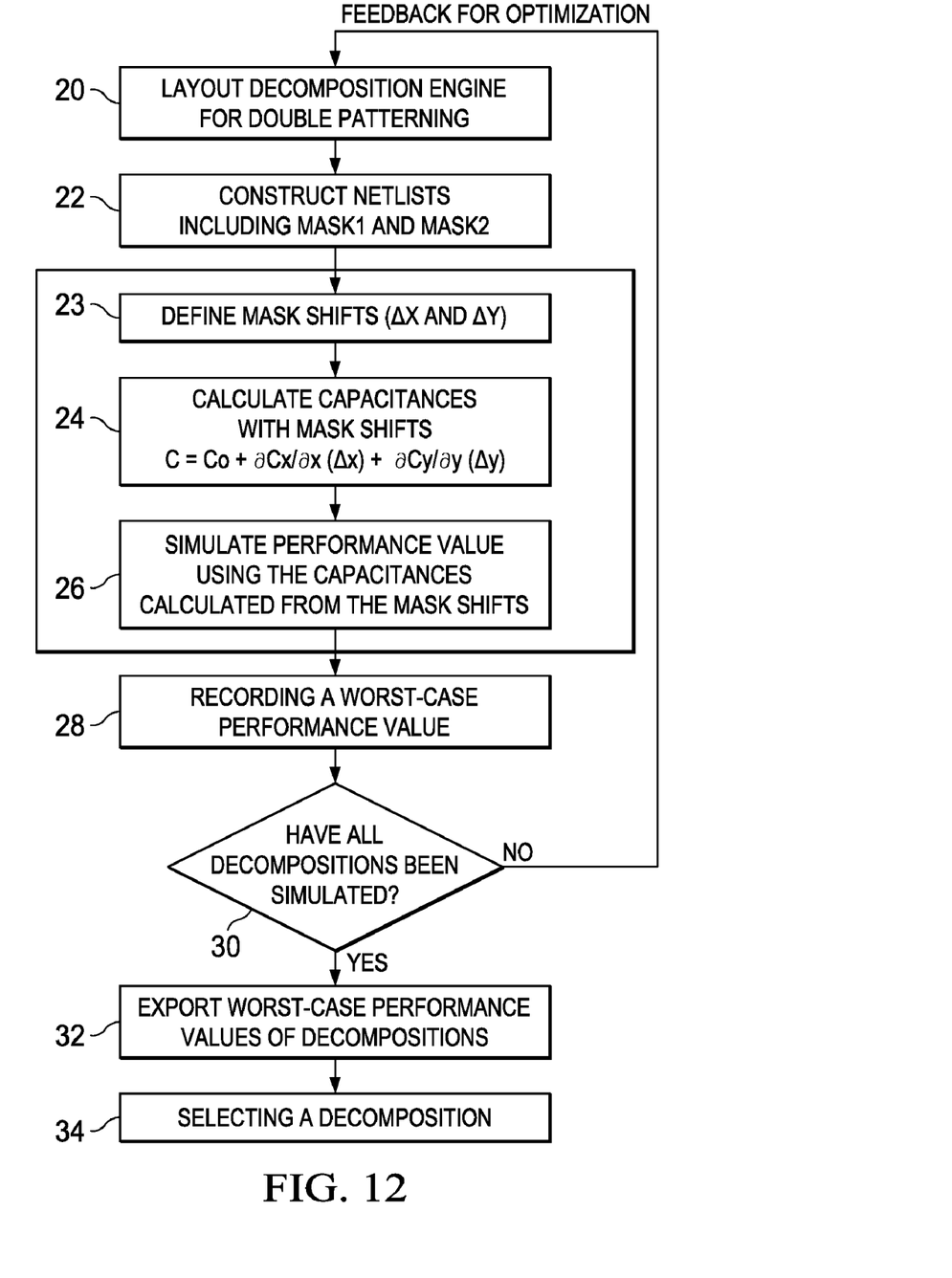
FIG. 12 illustrates a flow of a double patterning design in accordance with an embodiment.

FIG. 12 illustrates the flow of finding the optimum decomposition in accordance with an embodiment. Referring to step 20, a layout of an integrated circuit is provided to a decomposition engine for performing decomposition. All available decompositions (such as schematically illustrated in FIGS. 11A and 11B) are generated by the decomposition engine. For each of the decompositions, a netlist is generated (step 22), wherein the netlist includes patterns in mask1 and mask2 that belong to a same double patterning mask set, for example.

Next, in step 23, mask shifts are defined, and may include $\Delta x$ and $\Delta y$ that are transition shifts. In addition, mask shifts may also include the magnification shift and the rotation shift. In the techfiles, the maximum mask shift for each of the metal layers has been defined. Accordingly, mask shifts $\Delta x$ and $\Delta y$ are defined as being within the range of the maximum shifts as defined in the techfiles. For example, as shown in FIG. 9, in metal layer M1, the maximum transition shift in −x direction is 0.02 (the unit is not listed since this is an example), and the maximum transition shift in +x direction is 0.02. Accordingly, it is known that for each decomposition, the shifts in metal layer M1 and in the +x/−x direction will not exceed 0.02, although the real mask shift at the manufacturing time cannot be predicted.

Since the actual mask shift may be at any value less than the maximum mask shift, the range defined by the maximum shift may be divided into steps, and for each of the steps, the performance value of the circuit may be simulated. For example, assuming a maximum shift is 0.02, then it can be assumed that the actual mask shift may be 0.005, 0.01, 0.015, or 0.02. For each of these four assumed mask shifts, the performance values of the circuit may be simulated. Referring to FIG. 2A as an example, the capacitance between patterns A and B without any mask shift is already included in the techfiles, or can be calculated. Further, the capacitance between patterns A and B when the mask shifts (for example, the shift in the x direction) is 0.005, 0.01, 0.015, or 0.02 can be calculated using Equation 3 and the sensitivity of capacitance in the techfiles.

Similar to the mask shift in the x direction, the mask shift in the y direction also has a maximum shift, as also shown in FIG. 9. Further assuming that the maximum shift 0.02 of metal layer M1 in the y direction is also divided into four steps, then there are 16 combinations. If the magnification shift and the rotation shift are further taken into account, there are even more combinations. In step 24, for each of the combinations, the respective capacitance is calculated using Equation 3.

In alternative embodiments, the maximum mask shifts listed in the techfiles are used directly to calculate the performance value without being divided into steps. Accordingly, for each of the decompositions, the calculation is much faster.

Next, as shown in step 26, the corresponding performance values, such as the timing (of critical paths, for example) and noise, for each of the above-discussed mask shift combinations may be simulated using the capacitances already calculated in step 24. The methods for simulating the performance values from the capacitances are known in the art, and hence are not discussed herein. The performance values obtained from different mask shift combinations are compared to find the worst-case performance value, for example, the worst timing of critical paths. Again, although the actual mask shift at manufacturing time cannot be predicted, the performance value of the circuit when the worst-case scenario occurs is already obtained, and will be recorded in step 28.

The worst-case performance value obtained in preceding steps is for one of the decompositions, a loop is used to calculate/estimate the worst-case performance value for each of the available decompositions obtained in step 20. In the loop, it is determined (step 30) whether the worst-case performance values of all decompositions have been calculated, and if not, a calculation is performed for the next decomposition. If the worst-case performance values of all decompositions have been calculated, the worst-case performance values are exported (step 32) for further examination. In an embodiment, the decomposition whose worst-case performance value is the best among the worst-case performance values of all decompositions may be selected (step 34), and is used to make physical double patterning lithography masks mask1 and mask2. The integrated circuit will then be manufactured on wafer using the selected decomposition.

With the worst-case performance values being estimated, designer, at the time of design, may perform a design margin analysis and check whether the worst-case performance, such as the worst-case timing or the worse-case noise, is in the design margin or not. Further, with the adoption of the decomposition whose worst-case performance value being the best among all available decompositions, foundries may manufacture integrated circuits using the best decomposition scheme.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
providing a layout of an integrated circuit design;
generating a plurality of double patterning decompositions from the layout, with each of the plurality of double patterning decompositions comprising patterns separated to a first mask and a second mask of a double patterning mask set;
determining a maximum shift between the first and the second masks, wherein the maximum shift is a maximum expected mask shift in a manufacturing process for implementing the layout on a wafer; and
for each of the plurality of double patterning decompositions, simulating a worst-case performance value, wherein the step of simulating is performed using mask shifts within a range defined by the maximum shift.

2. The method of claim 1 further comprising:
comparing the worst-case performance values of the plurality of double patterning decompositions;
selecting a decomposition from the plurality of double patterning decompositions, wherein the worst-case performance value of the decomposition is the best among the worst-case performance values of the plurality of double patterning decompositions; and
using the decomposition to perform double patterning lithography steps on wafers.

3. The method of claim 1 further comprising:
generating a techfile comprising:
capacitances of patterns in the layout as a function of spacings between the patterns; and
capacitance sensitivities of the capacitances to changes in the spacings, wherein the techfile is used in the step of simulating the worst-case performance value of the each of the plurality of double patterning decompositions.

4. The method of claim 3 further comprising:
retrieving a capacitance from the techfile;
calculating a new capacitance using the capacitance and one of the mask shifts by adding a product of the one of the mask shifts and a respective one of the capacitance sensitivities to the capacitance; and
using the new capacitance to calculate a performance value of the integrated circuit design, with the performance value corresponding to the one of the mask shifts.

5. The method of claim 4, wherein the step of calculating the new capacitance is performed using a equation:

$$C = C_0 + \frac{\partial Cx}{\partial x}(\pm \Delta x) + \frac{\partial Cy}{\partial y}(\pm \Delta y)$$

wherein C is the new capacitance, $C_0$ is the capacitance without any mask shift, $$\frac{\partial Cx}{\partial x}$$

is a sensitivity of the capacitance to a mask shift in x direction, $$\frac{\partial Cy}{\partial y}$$

is a sensitivity of the capacitance to a mask shift in y direction, $\Delta x$ is the mask shift in the x direction, and $\Delta y$ is the mask shift in the y direction.

6. The method of claim 1, wherein the worst-case performance value comprises a timing of a critical path of the layout.

7. The method of claim 1, wherein the worst-case performance value comprises a noise of a critical path of the layout.

8. A method comprising:
providing a layout of an integrated circuit design;
generating a plurality of double patterning decompositions from the layout, with each of the plurality of double patterning decompositions comprising patterns separated to a first mask and a second mask of a double patterning mask set;
determining capacitances of patterns in the layout as a function of spacings between the patterns;
determining capacitance sensitivities of the patterns as a function of ranges of the spacings;
determining a maximum shift between the first and the second masks, wherein the maximum shift is a maximum expected shift in a manufacturing process for implementing the layout on a silicon wafer;
calculating a new capacitance of the patterns using the maximum shift;
for each of the plurality of double patterning decompositions, using the new capacitance to calculate a performance value;
comparing the performance values of the plurality of double patterning decompositions to select one of the plurality of double patterning decompositions, with the performance value of the one of the plurality of double patterning decompositions being the best among all of the plurality of double patterning decompositions; and manufacturing a double pattering mask set using the one of the plurality of double patterning decompositions.

9. The method of claim 8, wherein the capacitances are functions of widths of the patterns.

10. The method of claim 8 further comprising storing the capacitances of the patterns in the layout as a function of the spacings between the patterns into a techfile.

11. The method of claim 10 further comprising storing capacitance sensitivities of the patterns as a function of ranges of the spacings into the techfile.

12. The method of claim 8 further comprising:
generating a plurality of possible mask shifts, with the plurality of possible mask shifts being in a range defined by the maximum shift;
calculating additional new capacitances of the patterns using the plurality of possible mask shifts;
using the additional new capacitances to calculate additional performance values;
comparing the additional performance values and the performance value to determine a worst-case performance value for a respective decomposition, wherein the worst-case performance value is the worst among the additional performance values and the performance value; and
performing the step of selecting the one of the plurality of double patterning decompositions, wherein the worst-case performance value of the one of the plurality of double patterning decompositions is the best among the plurality of double patterning decompositions.

13. The method of claim 8, wherein the performance value comprises a timing of a critical path of the layout.

14. The method of claim 8, wherein the performance value comprises a noise of a critical path of the layout.

15. A method comprising:
providing a layout of an integrated circuit design;
generating a plurality of double patterning decompositions from the layout, with each of the plurality of double patterning decompositions comprising patterns separated to a first mask and a second mask of a double patterning mask set;
determining a maximum shift between the first and the second masks, wherein the maximum shift is a maximum expected shift in a manufacturing process for implementing the layout on a wafer;
for each of the plurality of double patterning decompositions:
generating a plurality of possible mask shifts, with the plurality of possible mask shifts being in a range defined by the maximum shift;
calculating new capacitances between the patterns using the plurality of possible mask shifts and the maximum mask shift;
using the new capacitances to calculate performance values;
selecting a worst-case performance value from the performance values; and
designating the worst-case performance value as being the worst-case performance value of the each of the plurality of double patterning decompositions;
selecting one of the plurality of double patterning decompositions, with the worst-case performance value of the one of the plurality of double patterning decompositions being the best among all of the plurality of double patterning decompositions; and
implementing the layout on the wafer using the one of the plurality of double patterning decompositions.

16. The method of claim 15, wherein the step of calculating the new capacitances is performed using a equation:

$$C = C_0 + \frac{\partial Cx}{\partial x}(\pm \Delta x) + \frac{\partial Cy}{\partial y}(\pm \Delta y)$$

wherein C is one of the new capacitances, $C_0$ is a capacitance without any mask shift, $$\frac{\partial Cx}{\partial x}$$

is a sensitivity of the one of the new capacitances to a mask shift in x direction, $$\frac{\partial Cy}{\partial y}$$

is a sensitivity of the one of the new capacitances to a mask shift in y direction, $\Delta x$ is the mask shift in the x direction, and $\Delta y$ is the mask shift in the y direction.

17. The method of claim 16, wherein the capacitance without any mask shift, the sensitivity of the one of the new capacitances to the mask shift in the x direction, and the one of the new capacitances to the mask shift in the y direction are stored in a techfile.

18. The method of claim 16, wherein the capacitance without any mask shift is a function of widths of the patterns.

19. The method of claim 15, wherein the performance values comprise timings of critical paths of the layout.

20. The method of claim 15, wherein the performance values comprise a noise of the layout.

* * * * *